(12) United States Patent
Tatah et al.

(10) Patent No.: US 9,590,390 B1
(45) Date of Patent: Mar. 7, 2017

(54) LASER DIODE WITH DUAL LASER GAIN SECTIONS

(71) Applicant: Seagate Technology LLC, Cupertino, CA (US)

(72) Inventors: Karim Tatah, Eden Prairie, MN (US); Scott Eugene Olson, Eagan, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 15/004,239

(22) Filed: Jan. 22, 2016

Related U.S. Application Data

(60) Provisional application No. 62/106,319, filed on Jan. 22, 2015.

(51) Int. Cl.
| | |
|---|---|
| *H01S 5/06* | (2006.01) |
| *H01S 5/068* | (2006.01) |
| *H01S 5/10* | (2006.01) |
| *H01S 5/0625* | (2006.01) |
| *H01S 5/50* | (2006.01) |

(52) U.S. Cl.
CPC ........ *H01S 5/06821* (2013.01); *H01S 5/0625* (2013.01); *H01S 5/1021* (2013.01); *H01S 5/1039* (2013.01); *H01S 5/5018* (2013.01); *H01S 5/5027* (2013.01)

(58) Field of Classification Search
CPC ...... H01S 5/06; H01S 5/06821; H01S 5/0654; H01S 5/0625; H01S 5/10; H01S 5/1021; H01S 5/1039
See application file for complete search history.

(56) References Cited

U.S. PATENT DOCUMENTS

| | | | |
|---|---|---|---|
| 2006/0164960 A1* | 7/2006 | Poon ...................... | G11B 7/124 369/124.01 |
| 2009/0080482 A1* | 3/2009 | Makino .................. | B82Y 20/00 372/45.01 |
| 2011/0142085 A1* | 6/2011 | Yousefi .................. | H01S 5/0622 372/20 |

* cited by examiner

*Primary Examiner* — Armando Rodriguez
(74) *Attorney, Agent, or Firm* — Hollingsworth Davis, LLC

(57) ABSTRACT

A laser diode has a first gain section having a first length and a second gain section having a second length and aligned with the first gain section. The second gain section is aligned with and coupled to the first gain section along a light output direction. The second length is an integer multiple m of the first length, where m is greater than one.

18 Claims, 3 Drawing Sheets

$L_1 = mL_2$

LASER DIODE WITH DUAL LASER GAIN SECTIONS

RELATED PATENT DOCUMENTS

This application claims the benefit of Provisional Patent Application Ser. No. 62/106,319 filed on Jan. 22, 2015, to which priority is claimed pursuant to 35 U.S.C. §119(e), and which is incorporated herein by reference in its entirety.

SUMMARY

The present disclosure is directed to a laser diode with dual gain sections. In one embodiment, a laser diode has a first gain section having a first length and a second gain section having a second length and aligned with the first gain section. The second gain section is aligned with and coupled to the first gain section along a light output direction. The second length is an integer multiple m of the first length, where m is greater than one.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

This disclosure relates to laser designs, e.g., semiconductor lasers. Such lasers have many applications, including telecommunications, medicine, and data storage technologies. As an example of the latter, a new magnetic storage technology alternately known as heat-assisted magnetic recording (HAMR), magnetic recording (EAMR), thermally-assisted recording (TAR), thermally-assisted magnetic recording (TAMR), etc., utilizes a laser diode or similar energy source to heat a recording medium such as a magnetic disk while recording data. While the present disclosure describes laser designs in the context of HAMR devices, it will be understood that the laser designs described herein may be usable for other applications having similar requirements.

Figure 1:
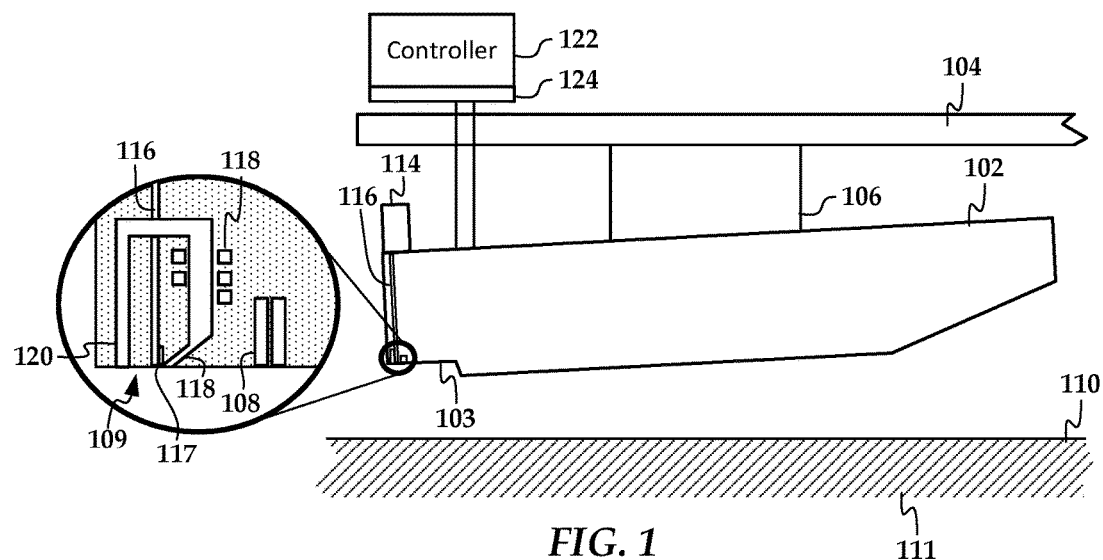
FIG. 1 is a block diagram of a hard drive slider and media arrangement according to an example embodiment.

A HAMR read/write head 102 according to an example embodiment is shown in the block diagram of FIG. 1. The read/write head 102 may be used in a HAMR data storage device, e.g., HAMR magnetic hard disk drive (HDD). The read/write head 102 may also be referred to herein as a slider, read head, recording head, write head, etc. The read/write head 102 is coupled to an arm 104 by way of a suspension 106, e.g., a gimbal. The read/write head 102 includes at least one read transducer 108 and at least one write transducer 109 at a media-facing surface 103. The transducers 108, 109 are held proximate to a surface 110 of a magnetic recording medium 111, e.g., a magnetic disk.

The read/write head 102 includes a laser 114 coupled to an optical path 116 integrated into the read/write head 102. The optical path 116 delivers energy to a near-field transducer 117 that is part of the write transducer 109. The near-field transducer 117 achieves surface plasmon resonance in response to the optical energy, and directs the surface plasmons to heat a surface of the recording medium 111 when recording data. The write transducer 109 also includes a write coil 118, write pole 119, and return pole 120. While the recording medium 111 is being heated, the write coil 118 is energized to create a magnetic field that is directed to the recording medium via a respective write pole 119 and return pole 120.

A controller 122 includes logic circuits that control current supplied to the laser 114, as well controlling the as sending and receiving of signals to and from the recording head. Those signals include read and write channel data, adaptive fly height control signals, etc. An interface 124 conditions the signals between the controller 120 and the read/write head, performing pre-amplification, filtering, analog-to-digital conversion, digital-to-analog conversion, encoding, decoding, etc.

Figure 2:
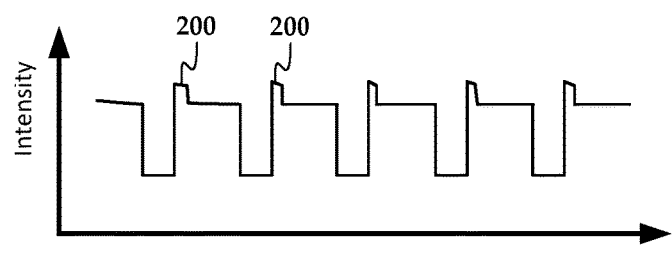
FIGS. 2 and 3 are plots showing examples of optical feedback in a slider according to an example embodiment.
Figure 3:
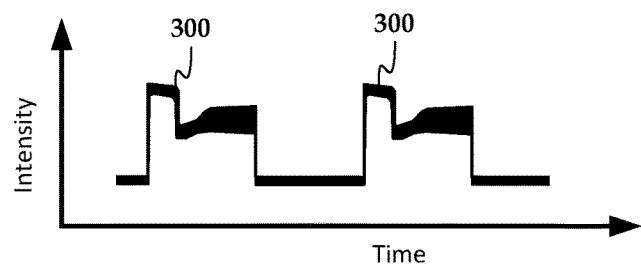

It has been found that the HAMR laser diodes can experience power instabilities (e.g., jumps) whenever there is external optical feedback to the internal gain sections of the laser. This may appear as unwanted peaks in the optical output of the laser at the start of lasing. Experimental data shows a correlation between photo-detected power jumps and anomalies in recorded transition shifts. In FIGS. 2 and 3, plots shows peaks 200, 300 measured from a single-resonator laser coupled to a HAMR read/write head according to an example embodiment. The plot in FIG. 2 is recorded by a photodiode on a flying head-gimbal assembly during HAMR recording. The plot in FIG. 3 is from laser on a laser diode unit (LDU) with 4% optical feedback from reflector 5 µm away from the front facet of laser. The similarities suggest that the peaks seen in HAMR recording are due to optical feedback. The power jumps can be as high as 20% to 30%. The power jumps cause jitter instability in HAMR recording which can have a direct impact on signal-to-noise ratio (SNR) and bit-error-rate (BER) in the recording process. Mode hopping instabilities are observed at laser diode unit (LDU) level, laser-slider assembly (L-slider) level, and head gimbal assembly (HGA, static and flying) levels.

Optical feedback can originate from a number of sources. One of these feedback sources is the input coupler interface where the laser is optically coupled to a waveguide integrated into the read/write head. Another potential source of feedback is where the near-field transducer interfaces with the recording medium at or near the air-bearing surface. This optical feedback introduces mode selectivity between internal laser resonator and an external resonator, the latter including the laser facet and external reflector. Mode competition among these resonators induced by laser gain shift with injected current and self-heat leads to power jump instabilities.

A laser cavity design is considered here that avoids multiple cavity mode competition and relies on a single chip with coupled cavity resonator to avoid mode hopping power instabilities and meet the power stability required by HAMR. As shown in the side and top views of FIGS. 4 and 5, a laser 400 according to an example embodiment may be a coupled-cavity laser formed by forming two laser gain sections 402, 404 (also referred to as "active regions") that are aligned with one another, e.g., both are aligned to a common centerline 401 that defines a light propagation direction. The lengths of the two gain sections 402, 404 are chosen such that they are in ratio of integers, e.g., $L_1=m*L_2$, where m is an integer greater than one. This allows for a stable laser without intensity mode hops. The locking of the longitudinal modes outside the reach of the gain shift due to self-heating avoids mode hops seen in single Fabry-Perot resonator lasers with presence of external feedback.

This use of coupled-cavity resonator within the laser chip minimizes modes induced by external optical feedback in heat-assisted magnetic recording (HAMR) devices and similar applications where optical feedback may occur. The goal is to prevent optical feedback longitudinal mode competition that leads to mode hopping power instability. The coupled-cavity laser design solves optical power instabilities caused by optical feedback that are detrimental to areal density and BER in HAMR recording.

The laser designs described herein use a coupled-cavity laser structure which makes the laser stable against optical feedback and mode hopping power instabilities. Such a coupled cavity laser can be formed by etching a gap 406 in a gain medium, the gap being located such that the two laser gain sections 402, 404 have lengths with an integer ratio as described above. In this example, the gap 406 extends to a substrate 407 upon which the first and second gain sections 402, 404 are deposited. The etching process can be wet and/or dry etching in conjunction with the semiconductor laser growth process or post-process. The gap created by etching can be left as an air gap and sealed off, or can be filled by a suitable material. For example, a dielectric such as $SiO_2$ may fill the gap.

Reflective ends 408, 410 cover the gain sections 402, 404, and an output facet may be formed on either end 408, 410. The laser 400 will include additional features not shown, such as anode and cathode electrical connections. In other embodiments, the laser gain sections 402, 404 may be formed in one step by photolithography, e.g., using a photomask that forms gain sections 402, 404 with gap 406 in one deposition step. The gap 406 may be filled in subsequent step of the manufacturing process.

Figure 4:
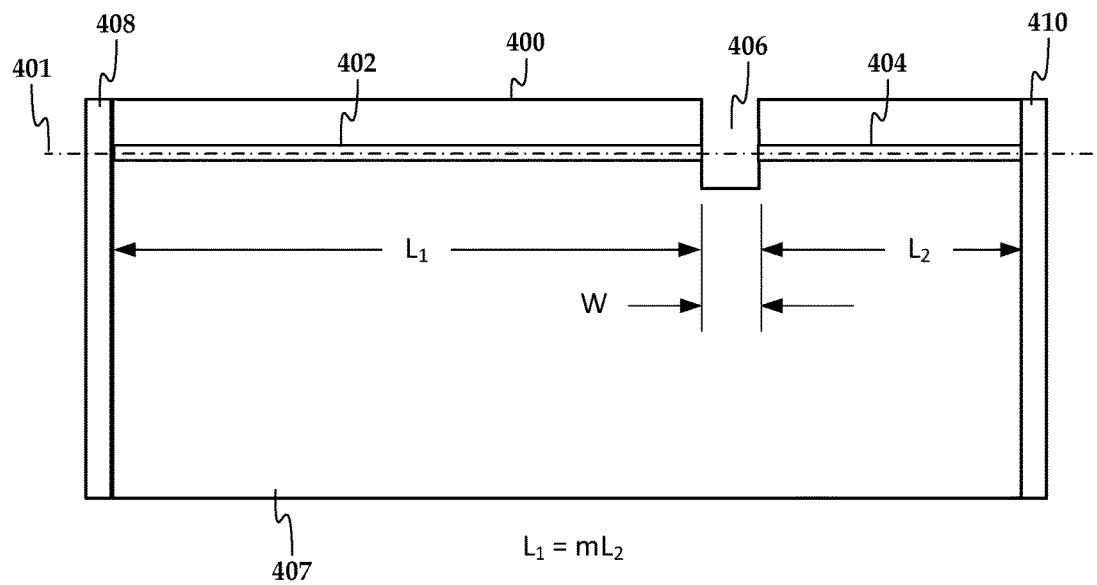
FIGS. 4 and 5 are top and side views of a laser according to an example embodiment.
Figure 5:
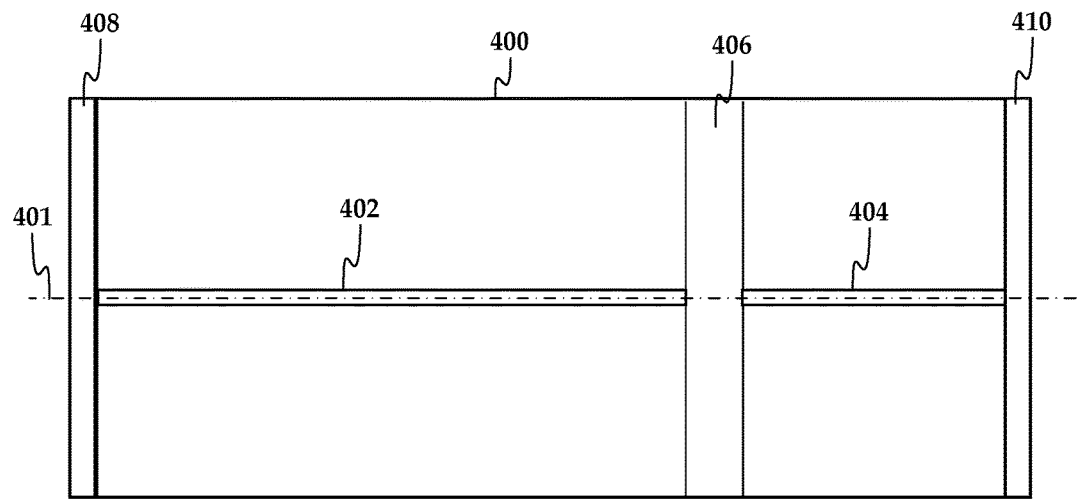

A dual coupled cavity laser as in FIGS. 4 and 5 is made laser optical-feedback-tolerant by choosing the laser cavity optical path lengths in ratio of integers: $L_1=m*L_2$ where m is an integer greater than one. The coupled cavities select longitudinal modes that meet the Vernier overlap of each cavity longitudinal modes. The overlap longitudinal mode will be dictated by the free spectral range of the shorter cavity which will have large free spectral range: $\Delta\lambda=\lambda^2/2 (n_{GaAs}*L_2)$. This large spectral range makes the gain less likely to shift to the next common mode of the coupled cavity with self-heating of the laser, e.g., within the operating conditions of the laser. The shorter cavity length can be designed for instance to span 1 to 10 μm lengths so that the gain excursion with heat does not reach (hop) to the next common (Vernier overlap) longitudinal mode. This may include a length of any value between 1 μm and 10 μm, and is not intended to be limiting.

Figure 6:
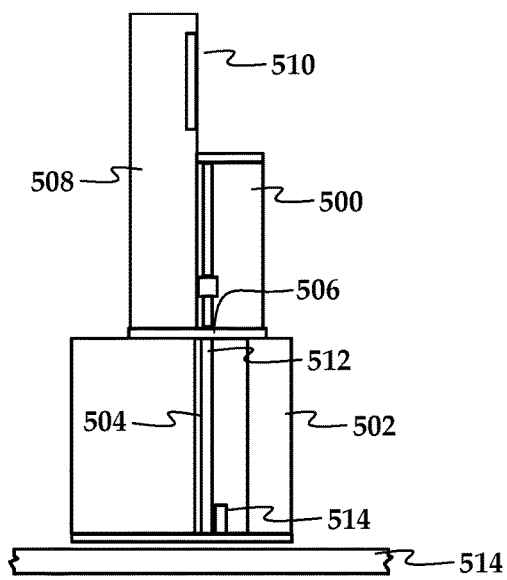
FIG. 6 is a block diagram of a laser-slider assembly according to an example embodiment.

In FIG. 6, a diagram (not to scale) shows the assembly of laser to slider according to an example embodiment. A coupled-cavity laser 500 (e.g., as shown in FIGS. 4 and 5) is assembled to a slider 502, e.g., by direct solder with passive or active alignment with maximum optical coupling between the slider optical waveguide delivery 504 and the laser facet 506. The laser 500 may be assembled to the slider 502 by a submount 508, which provides mechanical support and electrical coupling for the laser 500. A photodetector 510 may be included on the submount 508. The photodetector 510 is used to detect optical output of the laser 500.

Also seen in FIG. 6 is an input coupler 512 that efficiently couples the output of the laser 500 with the waveguide 504. For example, the input coupler 512 may include a tapered shape and be embedded in between a core and a cladding layer of the waveguide 504. The waveguide 504 couples light into a near-field transducer 514, which achieves surface plasmon resonance in response. The surface plasmons are shaped and directed to heat the surface of a recording medium 514, e.g., a magnetic disk.

A coupled-cavity laser may be assembled to a slider in other configurations. For example, the laser may be assembled to a top surface of a slider with the gain sections parallel to the top surface. In such a case, an optical turning element (e.g., mirror) may be used to redirect the light towards the near-field transducer. In other arrangements, coupled-cavity laser may be placed on a trailing edge of a slider, with the gain sections parallel to the trailing edge surface (e.g., in a cross-track direction or vertical direction) or normal to the trailing edge.

Figure 7:
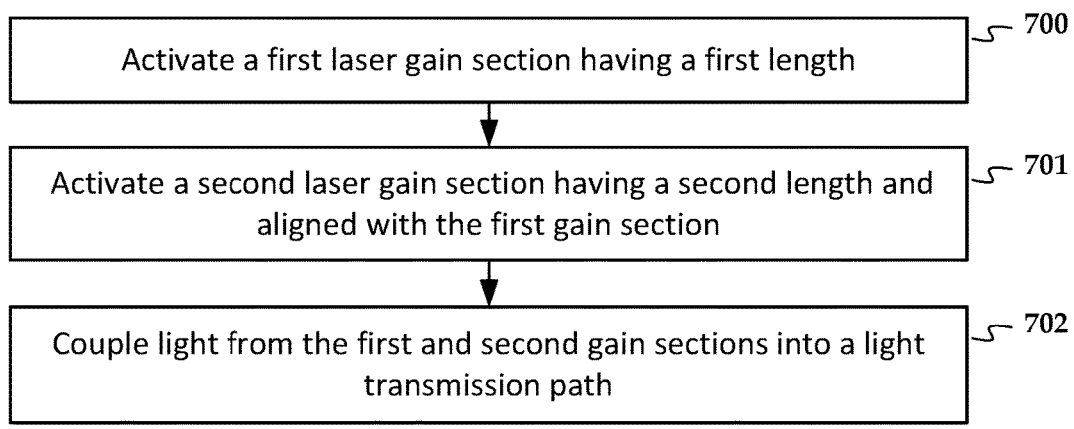
FIG. 7 is a flowchart of a method according to an example embodiment.

In FIG. 7, a flowchart illustrates a method according to an example embodiment. The method involves activating 700 a first laser gain section having a first length. A second laser gain section is also activated 701. The second gain section has a second length and is aligned with the first gain section. Both are integrated into a common laser structure, the second gain section aligned with and coupled to the first gain section along a light output direction, the second length being an integer multiple m of the first length, where m is greater than one. The light from the first and second gain sections is coupled 702 into a light transmission path. For example, the light may be coupled into a slider-integrated waveguide of a HAMR read/write head and used to heat a HAMR recording medium when writing.

The various embodiments described above may be implemented using circuitry and/or software modules that interact to provide particular results. One of skill in the computing arts can readily implement such described functionality, either at a modular level or as a whole, using knowledge generally known in the art. For example, the flowcharts illustrated herein may be used to create computer-readable instructions/code for execution by a processor. Such instructions may be stored on a non-transitory computer-readable medium and transferred to the processor for execution as is known in the art.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A laser diode, comprising:
   a first gain section having a first length;
   a second gain section having a second length and aligned with the first gain section, the second gain section aligned with and coupled to the first gain section along a light output direction, the second length being an integer multiple m of the first length, where m is greater than one; and
   a gap etched between the first and second gain sections.

2. The laser diode of claim 1, wherein the first and second gain sections are coupled to only one reflective end of the laser diode.

3. The laser diode of claim 1, wherein the first and second lengths are selected to meet a Vernier overlap of respective first and second longitudinal modes of the first and second gain sections.

4. The laser diode of claim 1, wherein the first length is between 1 μm and 10 μm.

5. The laser diode of claim 1, wherein the gap comprises an air gap.

6. The laser diode of claim 1, wherein the gap is filled with a dielectric.

7. The laser diode of claim 1, wherein the gap extends to a substrate upon which the first and second gain sections are deposited.

8. An apparatus, comprising:
a laser coupled to a waveguide of a slider, the laser comprising:
    a first gain section having a first length;
    a second gain section having a second length and aligned with the first gain section, the second gain section aligned with and coupled to the first gain section along a light output direction, the second length being an integer multiple m of the first length, where m is greater than one; and
    a gap etched between the first and second gain sections.

9. The apparatus of claim 8, wherein the first and second gain sections are coupled to only one reflective end of the laser diode.

10. The apparatus of claim 8, wherein the first and second lengths are selected to meet a Vernier overlap of respective first and second longitudinal modes of the first and second gain sections.

11. The apparatus of claim 8, wherein the first length is between 1 μm and 10 μm.

12. The apparatus of claim 8, wherein the gap comprises an air gap.

13. The apparatus of claim 8, wherein the gap is filled with a dielectric.

14. The apparatus of claim 8, wherein the gap extends to a substrate upon which the first and second gain sections are deposited.

15. A method comprising:
activating a first laser gain section having a first length;
activating a second laser gain section, the second gain section aligned with and coupled to the first gain section along a light output direction, the first and second gain sections integrated into a common laser structure with a gap therebetween, the second length being an integer multiple m of the first length, where m is greater than one.

16. The method of claim 15, wherein activating the first and second laser gain sections couples light into a waveguide.

17. The method of claim 16, further comprising directing the light from the waveguide to a magnetic recording medium via a near-field transducer.

18. The method of claim 15, wherein the first and second lengths are selected to meet a Vernier overlap of respective first and second longitudinal modes of the first and second gain sections.

* * * * *